US010424363B2

(12) United States Patent
Uemura

(10) Patent No.: US 10,424,363 B2
(45) Date of Patent: Sep. 24, 2019

(54) STACK REFRESH CONTROL FOR MEMORY DEVICE

(71) Applicant: Micron Technology, Inc., Boise, ID (US)

(72) Inventor: Yutaka Uemura, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/026,559

(22) Filed: Jul. 3, 2018

(65) Prior Publication Data
US 2018/0315469 A1    Nov. 1, 2018

Related U.S. Application Data

(63) Continuation of application No. 15/449,688, filed on Mar. 3, 2017, now Pat. No. 10,020,046.

(51) Int. Cl.
G11C 11/406    (2006.01)
G11C 5/06      (2006.01)
G11C 5/14      (2006.01)
G11C 11/408    (2006.01)
G11C 11/4093   (2006.01)
G11C 11/4091   (2006.01)

(52) U.S. Cl.
CPC .......... G11C 11/40615 (2013.01); G11C 5/06 (2013.01); G11C 5/14 (2013.01); G11C 11/4087 (2013.01); G11C 11/4091 (2013.01); G11C 11/4093 (2013.01); G11C 11/40618 (2013.01)

(58) Field of Classification Search
CPC ................. G11C 5/14; G11C 11/40615
USPC ................................ 365/63, 222
See application file for complete search history.

(56) References Cited

U.S. PATENT DOCUMENTS

| 7,466,577 | B2 | 12/2008 | Sekiguchi et al. | |
| 7,543,108 | B2 | 6/2009 | Choi | |
| 8,559,258 | B1 | 10/2013 | Stephens, Jr. | |
| 8,582,373 | B2* | 11/2013 | Hollis | G11C 5/02 365/189.05 |
| 8,619,486 | B2 | 12/2013 | Hayashi et al. | |
| 8,675,436 | B2 | 3/2014 | Kim et al. | |
| 8,767,497 | B2 | 7/2014 | Marumoto et al. | |
| 8,803,545 | B2* | 8/2014 | Yoko | G06F 1/12 257/48 |
| 8,958,259 | B2 | 2/2015 | Sakakibara et al. | |
| 9,136,843 | B2* | 9/2015 | Tseng | H03K 19/003 |
| 9,230,610 | B2 | 1/2016 | Woo et al. | |
| 9,275,755 | B2 | 3/2016 | Kim | |

(Continued)

OTHER PUBLICATIONS

U.S. Appl. No. 15/449,688, entitled: "Stack Refresh Control for Memory Device" filed Mar. 3, 2017; pp. all.

Primary Examiner — Son L Mai
(74) Attorney, Agent, or Firm — Dorsey & Whitney LLP

(57) ABSTRACT

Apparatuses and methods for self-refreshing a plurality of dies are described. An example apparatus includes a first die including a first bank and a second bank, the first bank and the second bank including memory cells; and a second die vertically stacked with the first die, the second die including a third bank and a fourth bank, the third bank and the fourth bank including memory cells. The third bank is vertically aligned with the first bank. The first bank and the fourth bank are configured to be refreshed prior to refreshing the second bank and the fourth bank.

25 Claims, 8 Drawing Sheets

(56) References Cited

U.S. PATENT DOCUMENTS

| | | |
|---|---|---|
| 10,020,046 B1 | 7/2018 | Uemura |
| 2007/0228456 A1 | 10/2007 | Ikeda et al. |
| 2011/0109382 A1* | 5/2011 | Jin .......................... G11C 5/04 327/565 |
| 2014/0192606 A1* | 7/2014 | Kang ..................... G11C 5/025 365/222 |

* cited by examiner

FIG. 5A

Refresh Address Counter
Initial value of internal refresh address
(Initial Self-refresh Row Address)

| BANK Group Add | BANK Add | Row Add |
|---|---|---|
| 00 (BANK Group-0) | 00 (BANK-0) | 0000 0000 0000 0000 |

FIG. 5B

Refresh Address Converter
Initial value of converted internal refresh addresses
(Converted Initial Self-refresh Row Addresses)

| # of Die | Layer ID | BANK Group Add | BANK Add | Row Add |
|---|---|---|---|---|
| Die-0 (Master) | 10000000 | 00 (BANK Group-0) | 00 (BANK-0) | 0000 0000 0000 0000 |
| Die-1 (Slave) | 11000000 | 01 (BANK Group-1) | 01 (BANK-5) | 0000 0000 0000 0000 |
| Die-2 (Slave) | 11100000 | 10 (BANK Group-2) | 01 (BANK-10) | 0000 0000 0000 0000 |
| Die-3 (Slave) | 11110000 | 11 (BANK Group-3) | 11 (BANK-15) | 0000 0000 0000 0000 |
| Die-4 (Slave) | 11111000 | 00 (BANK Group-0) | 00 (BANK-0) | 0000 0000 0000 0000 |
| Die-5 (Slave) | 11111100 | 01 (BANK Group-1) | 01 (BANK-5) | 0000 0000 0000 0000 |
| Die-6 (Slave) | 11111110 | 10 (BANK Group-2) | 10 (BANK-10) | 0000 0000 0000 0000 |
| Die-7 (Slave) | 11111111 | 11 (BANK Group-3) | 11 (BANK-15) | 0000 0000 0000 0000 |

FIG. 6A

Die-0 (M) & Die-4 (S)

| BANK-0 | BANK-1 | BANK-4 | BANK-5 |
| BANK Group-0 | | BANK Group-1 | |
| BANK-2 | BANK-3 | BANK-6 | BANK-7 |
| BANK-8 | BANK-9 | BANK-12 | BANK-13 |
| BANK Group-2 | | BANK Group-3 | |
| BANK-10 | BANK-11 | BANK-14 | BANK-15 |

FIG. 6B

Die-1 (S) & Die-5 (S)

| BANK-0 | BANK-1 | BANK-4 | BANK-5 |
| BANK Group-0 | | BANK Group-1 | |
| BANK-2 | BANK-3 | BANK-6 | BANK-7 |
| BANK-8 | BANK-9 | BANK-12 | BANK-13 |
| BANK Group-2 | | BANK Group-3 | |
| BANK-10 | BANK-11 | BANK-14 | BANK-15 |

FIG. 6C

Die-2 (S) & Die-6 (S)

| BANK-0 | BANK-1 | BANK-4 | BANK-5 |
| BANK Group-0 | | BANK Group-1 | |
| BANK-2 | BANK-3 | BANK-6 | BANK-7 |
| BANK-8 | BANK-9 | BANK-12 | BANK-13 |
| BANK Group-2 | | BANK Group-3 | |
| BANK-10 | BANK-11 | BANK-14 | BANK-15 |

FIG. 6D

Die-3 (S) & Die-7 (S)

| BANK-0 | BANK-1 | BANK-4 | BANK-5 |
| BANK Group-0 | | BANK Group-1 | |
| BANK-2 | BANK-3 | BANK-6 | BANK-7 |
| BANK-8 | BANK-9 | BANK-12 | BANK-13 |
| BANK Group-2 | | BANK Group-3 | |
| BANK-10 | BANK-11 | BANK-14 | BANK-15 |

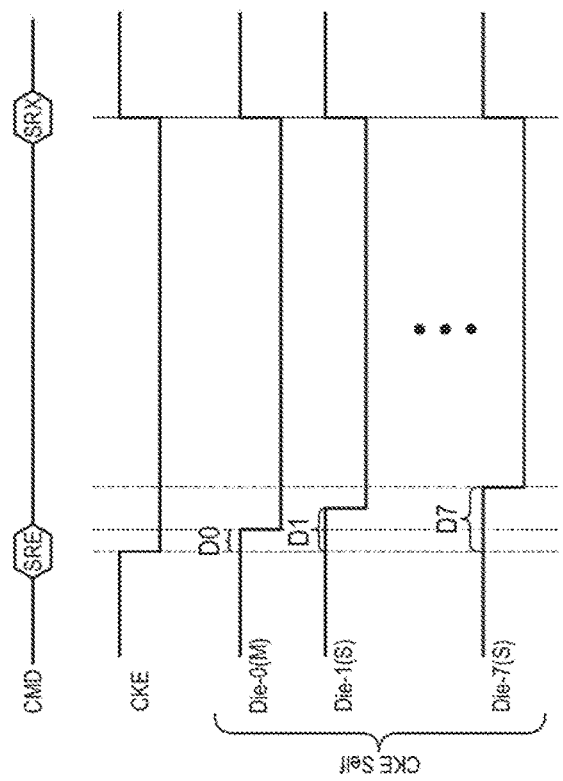
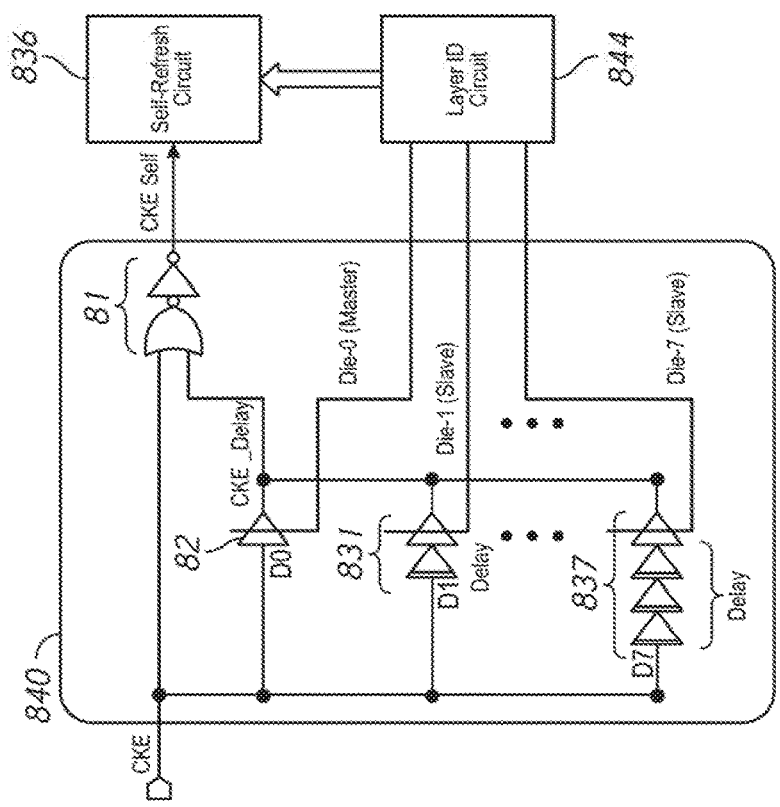
FIG. 8B
FIG. 8A

STACK REFRESH CONTROL FOR MEMORY DEVICE

CROSS-REFERENCE TO RELATED APPLICATION

This application is a continuation of U.S. patent application Ser. No. 15/449,688, filed Mar. 3, 2017 and issued as U.S. Pat. No. 10,020,046 on Jul. 10, 2018. This application, and issued patent, is incorporated by reference herein in its entirety and for all purposes.

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking dice vertically and interconnecting the dice using through-silicon (or through-substrate) vias (TSVs). Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC) and High Bandwidth Memory (HBM). There is another type of 3D memory device that is called "Master-Slave Memory".

For example, the Master-Slave Memory is a type of memory including a plurality of random access memory (DRAM) dies vertically stacked with each other, in which the lowermost one of the DRAM dies serves as a master die and remaining one or ones of DRAM dies serve as a slave die. Refresh operations of the stacked DRAM dies are executed periodically to maintain information stored in each memory cell. Each die executes the refresh operations. The refresh operation may be an auto refresh (AREF) operation periodically executed by a system (e.g., a memory controller) and a self refresh (SREF) operation automatically executed by the DRAM dies. An entry to the self refresh operation causes the stacked DRAM dies to automatically execute periodical refresh operations based on an internal timer and all the stacked DRAM dies execute refresh operations simultaneously. Thus, currents of all the stacked DRAM dies reach their peak values simultaneously due to the self refresh operation of all the slacked DRAM dies. A total of the peak currents increases as a number of the stacked DRAM dies increases. It may be desirable to stabilize internal voltages generated in each die even when all the DRAM dies execute the self refresh operation simultaneously.

BRIEF DESCRIPTION OF THE DRAWINGS

FIG. 5A is a table of an initial value of the internal refresh address in the refresh address counter (an initial self-refresh row address) in FIG. 4, in accordance with an embodiment of the present disclosure.

FIG. 5B is a table of initial values of converted internal refresh addresses in the refresh address converter (e.g., converted initial self-refresh row addresses) in FIG. 4, in accordance with an embodiment of the present disclosure.

FIG. 6A to FIG. 6D are tables indicating bank addresses highlighting an initial BANK address that is included in the initial value of the converted internal refresh address for a combination of dies, in accordance with an embodiment of the present disclosure.

FIG. 8A is a block diagram of an internal clock and timing signal generator, a layer ID circuit and a self-refresh circuit in a memory die, in accordance with an embodiment of the present disclosure.

FIG. 8B is a block diagram of signals in the internal clock and timing signal generator in FIG. 8A, in accordance with an embodiment of the present disclosure.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
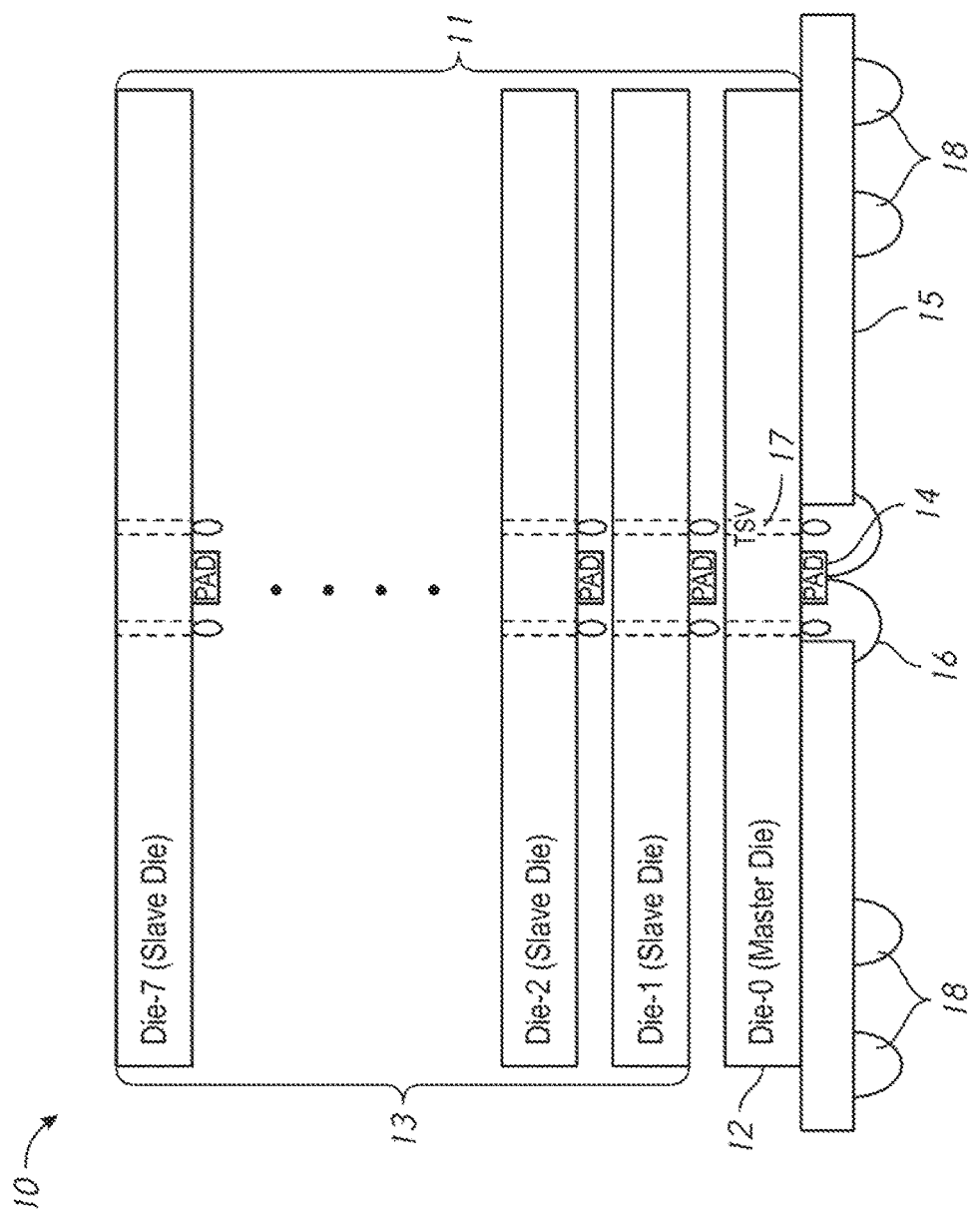
FIG. 1 is a schematic diagram of a memory device including a plurality of dies in accordance with an embodiment of the present disclosure.

FIG. 1 is a schematic diagram of a memory device 10 including a plurality of dies 11 in accordance with an embodiment of the present disclosure. For example, the number of the plurality of dies li may be, but not limited to eight. For example, the plurality of dies 11 maybe identical with each other with respect to circuit configurations and operations. For example, the plurality of dies 11 may be stacked dies including a master die 12 and a plurality of slave dies 13. The master die (Die-0) 12 may serve as a master that includes one or more pads PAD 14 that are coupled to a package substrate 15 via one or more bonding wires 16. The one or more bonding wires 16 may be coupled to lands (not shown) of the package substrate 15. Bonding Pads (PAD) of each of the plurality of slave dies 13 (Die-1 to Die-7) may be in a floating state, decoupled from the package substrate 15. The master die 11 may communicate with each of the slave dies 13 (Die-1 to Die-7) by way of vias TSV 17 (e.g., through-substrate or through-silicon vias). Bump electrodes 18 may be disposed on an outer surface of the package substrate 15. The bump electrodes 18 may be coupled to power lines or signal channels.

Figure 2:
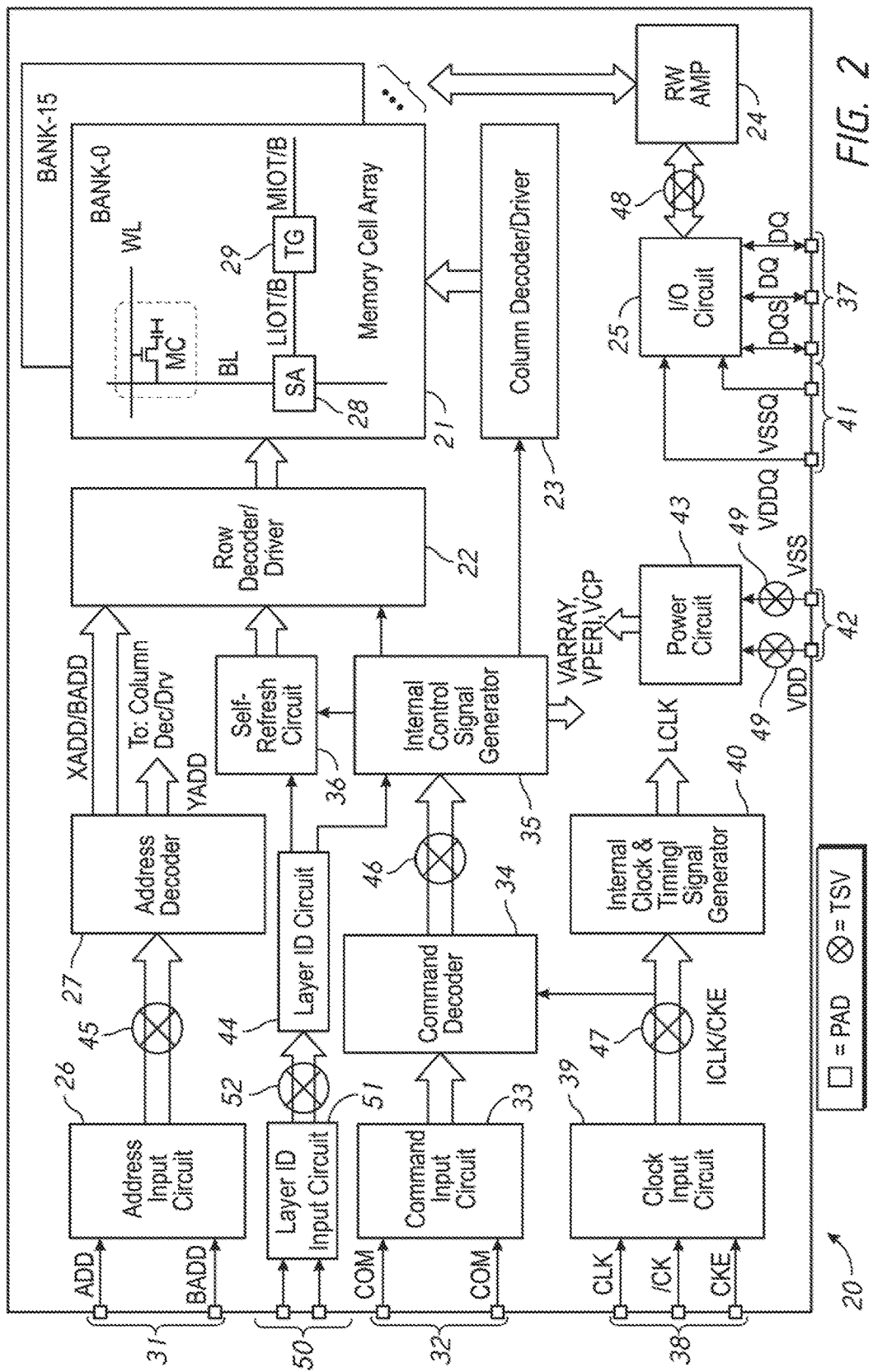
FIG. 2 is a block diagram of a memory die in accordance with an embodiment of the present disclosure.

FIG. 2 is a block diagram of a memory die 20 in accordance with an embodiment of the present disclosure. For example, the memory die 20 may be each die of the plurality of dies 11 in FIG. 1, which may be a DRAM die. As shown in FIG. 2, the memory die 20 may include a memory cell array 21. The memory cell array 21 includes a plurality of banks (e.g., BANK-0 to BANK-15), each bank including a plurality of memory cells MC arranged at intersections of a plurality of word lines WL and a plurality of bit lines BE. A selection of the word line WL is performed by a row decoder/driver 22 and a selection of the bit line BL is performed by a column decoder/driver 23. Sense amplifiers SA 28 are coupled to corresponding bit lines BL and connected to local I/O line pairs LIOT/B. Local IO line pairs LIOT/B are connected 10 main IO line pairs MIOT/B via transfer gates TG 29 which are configured as switches.

Turning to the explanation of a plurality of external terminals (or pads) included in the memory die 20, the plurality of external terminals (or pads) may include address terminals 31, command terminals 32, clock terminals 38, data terminals 37 and power supply terminals 41 and 42. The plurality of external terminals may be the pads 14 in FIG. 1. The address terminals 31 may receive address signals ADD and bank address signals BADD. The address signals ADD and the bank address signals BADD supplied to the address terminals 31 may be provided through an address input circuit 26 to an address decoder 27 in the master die (e.g., Die-0). The address decoder 27 of each slave die of the slave dice (e.g., Die-1 to Die-7)may receive the address signals ADD through address TSVs 45 from the master die (e.g., Die-0) and may provide decoded row address signals XADD to the row decoder/driver 22, and decoded column address signals YADD to the column decoder/driver 23. The address decoder 27 may also receive the bank address signals BADD and provide the bank address signals BADD to the row decoder/driver 22. While the address terminals 31 and the address input circuit 26 may be also included in each slave die of the slave dies (e.g., Die-1 to Die-7), the address decoder 27 of each slave die of the slave dies (e.g., Die-1 to Die-7) may receive the address signals ADD and the bank address signals BADD through address TSVs 45 from the master die (e.g., Die-0) and may provide decoded row address signals XADD and the decoded bank address signals BADD to the row decoder-driver 22, and decoded column address signals YADD to the column decoder/driver 23.

In master die (e.g., Die-0), the command terminals 32 may receive command signals COM to a command input circuit 33 that may provide the command signals COM to a command decoder 34. The command signals COM may include one or more separate signals. The command signals COM received by the command terminals 32 may be provided to the command decoder 34 via the command input circuit 33. The command decoder 34 may decode the command signals COM and provide the decoded command signals to an internal control signal generator 35. The decoded command signals may be provided to an internal control signal generator 35 of each slave die of the slave dies (e.g., Die-1 to Die-7) through command vias 46. The internal control signal generator 35 may generate various control signals. For example, the control signals may include a row command signal to select a word line and a column command signal, such as a read command or a write command, to select a bit line, and an auto refresh signal that may be provided to a self-refresh circuit 36.

Accordingly, when a read command is issued and a row address and a column address are timely supplied with the read command to the memory die 20, read data are read from memory cell or cells MC in the memory cell array 21 designated by these row address and column address responsive to a data strobe signal received at a DQS pad of the data terminals 37. The read data DQ are provided as output signals at DQ pads of the data terminals 37 through a read/write amplifier (RW AMP) 24 and an input/output (I/O) circuit 25 through data vias 48 between the read/write amplifier 24 and the input/output circuit 25. Similarly, when the write command is issued and a row address and a column address are timely supplied with the write command, and then write data DQ are supplied to the DQ pads together with the data strobe signal at the DQS pad of the data terminals 37, the write data DQ are supplied via the input/output circuit 25 and the read/write amplifier 24 to the memory cell array 21 and written in the memory cells MC designated by the row address and the column address. It is to be noted that the data paths between the input/output circuit 25 and the read/write amplifier 24 in a master die (e.g., Die-0) may be coupled through the data TSVs 48 to the data paths between the input output circuit 25 and the read/write amplifier 24 in each slave die of slave dies (e.g., Die-1 to Die-7). Thus, the input output circuit 25 of master die (e.g., Die-0) may further receive read data from each slave die of slave dies (e.g., Die-1 to Die-7) and write data to be written into each slave die of slave dies (e.g., Die-1 to Die-7).

The clock terminals 38 may receive external clock signals CLK and CLK, and a clock enable signal CKE of the master die (e.g., Die-0), respectively. These external clock signals CLK and CLK are complementary to each other and are supplied to a clock input circuit 39. The clock input circuit 39 may receive the external clock signals CLK and /CLK and may generate an internal clock signal ICLK. The clock input circuit 39 may provide the internal clock signal ICLK and the clock enable signal CKE to an internal clock and riming signal generator 40 and thus a phase controlled internal clock signal LCLK may be generated based on the received internal clock signal ICLK and the clock enable signal CKfc. Although not limited thereto, a DLL circuit can be used as the internal clock and timing signal generator 40. The phase controlled internal dock signal LCLK is supplied to the input/output circuit 15 and is used as a liming signal for determining an output timing of the read data DQ. The internal clock signal ICLK is also supplied to the command decoder 34 for decoding the command signal COM to generate various control signals. The internal clock signal ICLK and the clock enable signal CKE from the clock input circuit 39 of the master die (e.g., Die-0) may be further supplied through clock TSVs 47 to an internal clock and timing signal generator 40 of each die of the slave dies (e.g., Die-1 to Die-7) to perform similar operations to the internal clock and timing signal generator 40 of the master die (e.g., Die-0).

The power supply terminals 41 are supplied with power supply potentials VDDQ and VSSQ. These power supply potentials VDDQ and VSSQ are supplied to the input-output circuit 25. The power supply potentials VDDQ and VSSQ may be the same potentials as the power supply potentials VDD and VSS that are supplied to the power supply terminals 42, respectively. However, the dedicated power supply potentials VDDQ and VSSQ may be used for the input/output circuit 25 so that power supply noise generated by the input/output circuit 25 does not propagate to the other circuit blocks.

The power supply terminals 42 are supplied with power supply potentials VDD and VSS. These power supply potentials VDD and VSS are supplied to a power circuit 43. The internal power circuit 43 may generate various internal potentials VARRAY, VPERI, VCP and the like based on the power supply potentials VDD and VSS. The internal potential VCP may be a voltage higher than the power supply potential VDD generated by a charge pumping circuit (not shown) and may be mainly used in the row decoder/driver 22. The internal potential VARRAY may be mainly used in the sense amplifiers 28 included in the memory cell array 21, and the internal potential VPERI may be used in many other circuit blocks. The power supply potentials VDD and VSS supplied to the power supply terminals 42 of the master die (e.g., Die-0) may be provided to a power circuit 43 of each slave die of the slave dies (e.g., Die-1 to Die-7) through power TSVs 49 in order to generate internal potentials for each slave die.

The memory die 20 may include pads and vias (TSVs). As mentioned earlier, the pads may include the address terminals 31, the command terminals 32, the data terminals 37, the clock terminals 38, and power terminals 41 and 42. For example, the vias may be through silicon vias and the vias may include the address TSVs 45, the command TSVs 46, the clock TSVs 47, the data TSVs 48, the power TSVs 49, and layer TSVs 52. As mentioned earlier, the memory die 20 may be one of the plurality of dies 11 in FIG. 1 and the pads of the plurality of dies 11 and the vias of the plurality of dies 11 may be vertically aligned with one another. The vias of the plurality of dies 11 may be coupled to one another. Thus, various signals such command signals, address signals, data signals for receiving and transmitting from and/or to an external apparatus may be shared across the plurality of dies through the vias.

The memory die 20 may include a layer identifier (ID) circuit 44. The layer ID circuit 44 may set layer ID information unique to each memory die 20 in start-up (e.g., initializing) sequences. The memory die 20 may further include a set of layer ID terminals 50 that may receive layer ID information to designate a memory die to be accessed in access operations. While the layer ID information at the terminals 50 is supplied to the input circuit 51, the input circuit 51 may provide the layer ID information to the layer ID circuit 44 of the master die (e.g., Die-0) and may simultaneously provide the layer ID information to the layer ID circuit 44 of each slave die of the slave dies (e.g., Die-1 to Die-7) through the layer TSVs 52. The layer ID circuit 44 may activate the memory die 20 in response to the layer ID information and the command signals received at the command terminals 32, if the layer ID information is indicative of the memory die 20. The layer ID circuit 44 may also activate the internal control signal generator 35 and some other circuits. The layer ID circuit 44 may provide the layer ID information to the self-refresh circuit 36 that executes (e.g., performs) a self-refresh operation, responsive to a self-refresh command. Configuration of the self-refresh circuit 36 will be described in detail later in this disclosure.

Figure 3:
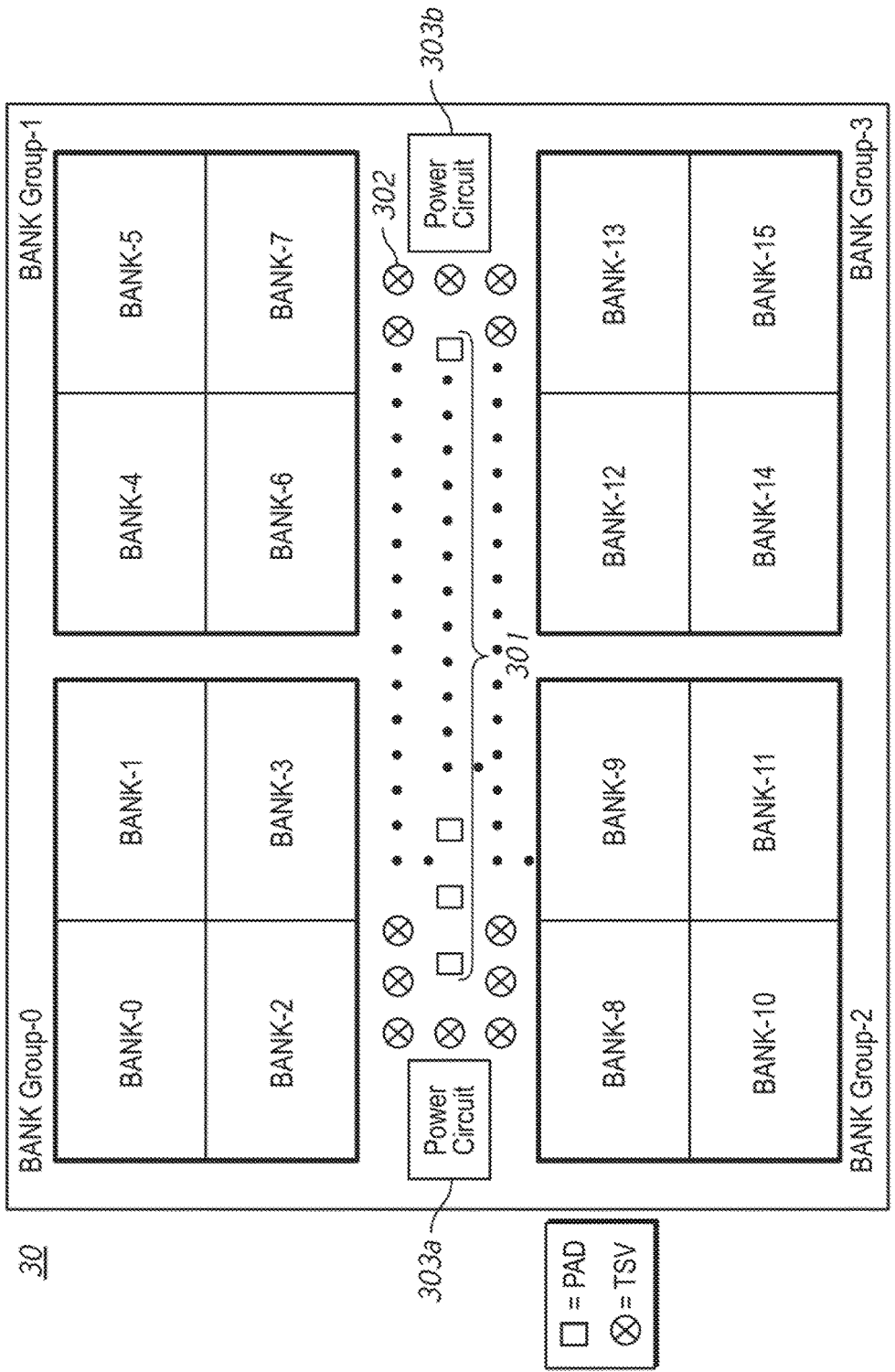
FIG. 3 is a layout diagram of a memory die in accordance with an embodiment of the present disclosure.

FIG. 3 is a layout diagram of a memory die 30, in accordance with an embodiment of the present disclosure. For example, the memory die may be the memory die 20 in FIG. 2. The memory die 30 may include a plurality of memory banks divided into a plurality of bank groups. For example, the number of the plurality of memory banks may be sixteen (e.g., BANK-0 to BANK 15) and the plurality of memory banks may be divided into four bank groups (e.g., BANK Group-0 to BANK Group-3). Thus, each bank group may include a plurality of banks (e.g., four banks).

For example, areas outside of the banks may be peripheral areas including a central area and edge areas. The peripheral areas may include various functional blocks shown in FIG. 2. For example, a plurality of pads (PADs) 301 may be provided in a line in a center of the memory die 30. Alternatively, the plurality of pads 301 may be provided in a plurality of lines. A plurality of vias (TSVs) 302 may be disposed around the plurality of pads 301. A plurality of power circuits 303 (for example, two) may be disposed at two opposite sides of the memory die 30. The plurality of pads 301 and the plurality of TSVs 302 may be disposed between the plurality of power circuits 303*a* and 303*b*. For example, the power circuit 303*a* may be located closer to BANK Group-0 and BANK Group-1, and the power circuit 303*b* may be located closer to BANK Group-2 and BANK Group-3. The power circuit 303*a* and the power circuit 303*b* may generate internal voltages and provide the internal voltages to the internal functional blocks and each bank. For example, each power circuit 303 may function as the power circuit 43.

Figure 4:
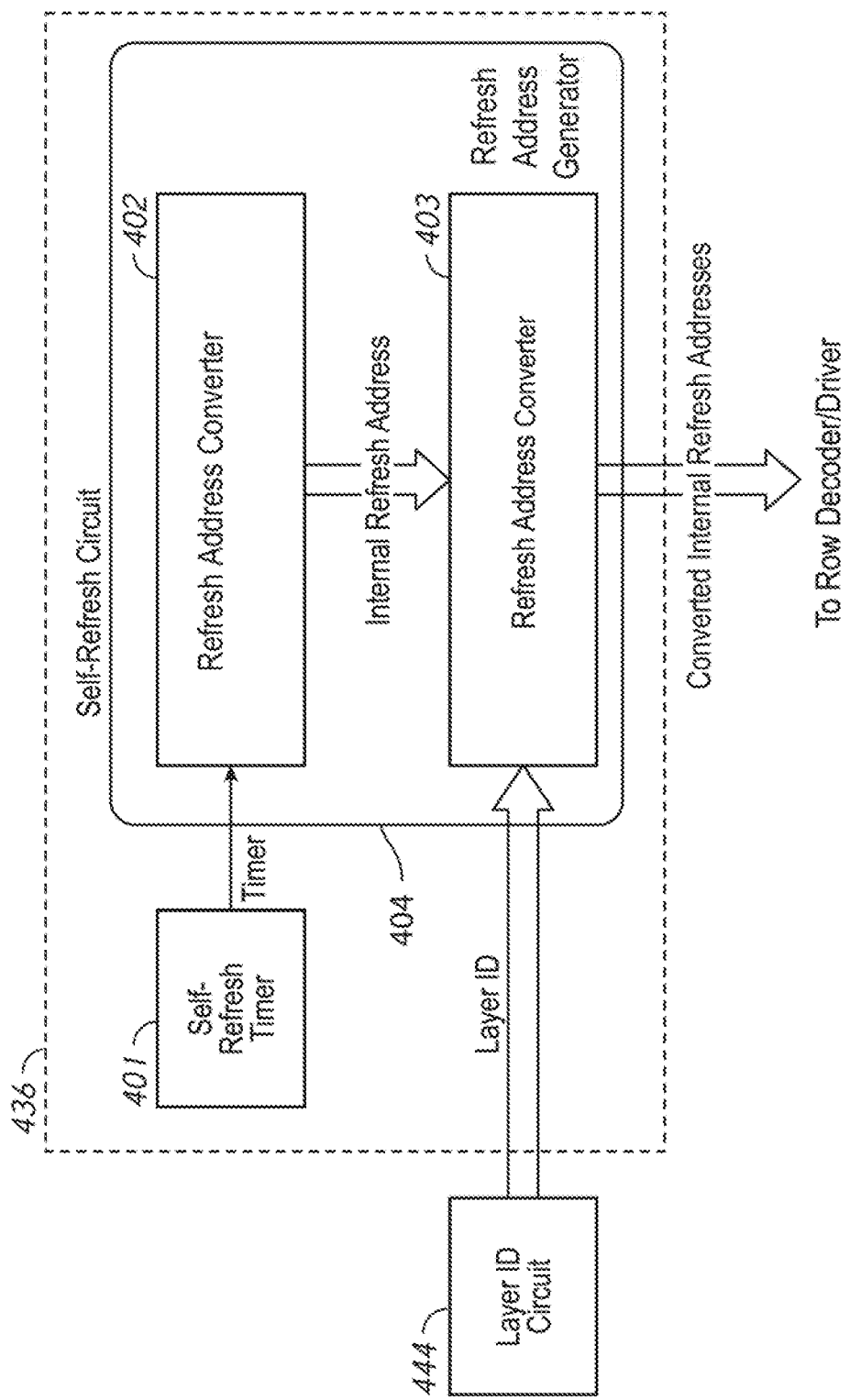
FIG. 4 is a block diagram of a self-refresh circuit and a layer identifier (ID) circuit in accordance with an embodiment of the present disclosure.

FIG. 4 is a block diagram of a self-refresh circuit 436 and a layer identifier (ID) circuit 444 in accordance with an embodiment of the present disclosure. For example, the self-refresh circuit 436 may be used as the self-refresh circuit 36 in the memory die 20 in FIG. 2. For example, the layer ID circuit 444 may be used as the layer ID circuit 44 in the memory die 20 in FIG. 2. When a memory die (e.g., the master die Die-0 12 in FIG. 1) receives a self-refresh command through pads (e.g., the command terminals 32), a command input circuit (e.g., the command input circuit 33 in FIG. 2) may receive the self-refresh command and provide the self-refresh command to a command decoder (e.g., the command decoder 34) of the memory die (e.g., the master die Die-0 12). The command decoder of the memory die (e.g., the master die Die-0 12) may provide a decoded self-refresh command to command TSVs (e.g., the command TSVs 46 in FIG. 2) and the decoded self-refresh command may be provided to internal control signal generators (e.g., internal control signal generator 35 in FIG. 2) of memory dies, including the memory die (e.g., the master die Die-0 12 in FIG. 1) and other memory die(s) (e.g., slave dies Die-1 to Die-7 13 in FIG. 1). Thus, each internal control signal generator of each memory die among the memory dies (e.g., the master die Die-0 12 in FIG. 1 and slave dies Die-1 to Die-7 13 in FIG. 1) may provide an activation signal to a self-refresh circuit 436 (e.g., the self-refresh circuit 36) responsive to the sell-refresh command and an inactive state of the clock enable signal CKE (e.g., a logic low ("0") level). The self-refresh circuit 436 in each memory die may execute the self-refresh operation responsive to the activation signal from the internal control signal generator. In the self-refresh operation, a self-refresh tinier 401 may be activated and may provide a timer signal in a self-refresh cycle period.

The self-refresh circuit 436 may include a refresh address generator 404. The refresh address generator 404 may generate an initial self-refresh address that may include a bank address of one bank among the plurality of banks to be self-refreshed. For example, the refresh address generator 404 may include a refresh address counter 402 and a refresh address converter 403. The refresh address counter 402 may update (e.g., increment, decrement) an internal refresh address and provide the internal address responsive to the timer signal. For example, the internal refresh address may be a self-refresh row address. FIG. 5A is a table of an initial value of the internal refresh address in the refresh address counter 402 (e.g., an initial self-refresh row address) in FIG. 4, in accordance with an embodiment of the present disclosure. For example, the initial value may be a combination of a BANK group address, a BANK address and a row address all set to "0" to indicate BANK Group-0, BANK-0 and an initial row address, respectively. The refresh address converter 403 may receive the internal refresh address from the refresh address counter 402 and a layer ID (e.g., the layer ID information in FIG. 2) from the layer ID circuit 444. The refresh address converter 403 may convert the internal refresh address into a convened initial refresh address responsive to the layer ID. FIG. 5B is a table of initial values of converted internal refresh addresses in the refresh address converter 403 (e.g., converted initial self-refresh row addresses) in FIG. 4, in accordance with an embodiment of the present disclosure. Here, the initial value of the internal refresh address may be converted to the initial value of converted internal refresh address that has the BANK group address and the BANK address associated with the layer ID. For example, an initial value of the converted internal refresh address may include the combination of a BANK group address indicative of BANK group-0 (e.g., "00") and a BANK address indicative of BANK-0 (e.g., "00"), responsive to the layer ID "10000000" associated with Die-0 (a master die). For example, the initial value of the converted internal refresh address may be the combination of the BANK group address indicative of BANK group-1 (e.g., "01") and the BANK address indicative of BANK-5 (e.g., "01"), responsive to the layer ID "11000000" associated with Die-1 (a slave die).

For example, the same combination of the BANK group address indicative of BANK group-0 and the BANK address indicative of BANK-0 may be included in the converted internal refresh addresses for Die-0 and Die-4, as shown in FIG. 5B. Similarly, the same combination of the BANK group address indicative of BANK group-3 and the BANK address indicative of BANK-15 may be included in the converted internal refresh addresses for Die-3 and Die-7, as shown in FIG. 5B.

FIG. 6A to FIG. 6D are tables indicating bank addresses highlighting an initial BANK address that is included in the initial value of the convened internal refresh address for a combination of dies, in accordance with an embodiment of the present disclosure. For example, BANK-0 in BANK Group-0 may be the initial BANK address for Die-0 (Master) and Die-4 (Slave). For example, BANK-5 in BANK Group-1 may be the initial BANK address for Die-1 (Slave) and Die-5 (Slave). For example, BANK-10 in BANK Group-2 may be the initial BANK address for Die-2 (Slave) and Die-6 (Slave). For example, BANK-15 in BANK Group-3 may be the initial BANK address for Die-3 (Slave) and Die-7 (Slave). Thus, different combinations of the BANK group address and die BANK address (e.g., shown in FIG. 3) for a plurality of dies (e.g., two) but not for all dies may be included in the converted internal refresh address responsive to the layer ID as shown in FIG. 5B. Thus, a bank to be refreshed in one die and a bank to be refreshed in another die may not be vertically aligned (out of alignment). In other words, another bank to be refreshed in the other die that is vertically aligned to the hank to be refreshed in the one die may be refreshed at another time different from a time die bank to be refreshed in the one die and the bank to be the other die are refreshed. Thus, differences between peak currents of the TSVs for power supply (and thus the power circuits 303a and 303b in FIG. 3) may be kept within a threshold value across bank groups, and a peak current for each TSV for power supply (or each power circuit 303a or 303b) may be alleviated.

As the refresh address counter 402 provides an updated (e.g., incremented, decremented) internal refresh address responsive to the timer signal from the self-refresh timer 401, the refresh address converter 403 may provide the converted internal refresh addresses and a row address in a bank associated with the BANK address in each die may be updated (e.g., incremented, decremented). Once refreshing operations in all the rows are completed, the BANK address is updated by the refresh address counter 402 and the refresh address converter 403 may convert the updated BANK group address and the BANK address into updated BANK group address and BANK address for each die bused on the layer ID, and refreshing operations may be executed in a next bank associated with the updated BANK group address and the BANK address.

For each BANK, group, the BANK address may be updated to refresh a hank associated with the BANK address and the BANK-group address may be updated once all the BANK addresses arc refreshed. Orders of banks to be refreshed in each BANK group may be configured differently for BANK groups in FIG. 6A to FIG. 6D. For example, the refresh order for BANK group 0 may be BANK-0→BANK-1→BANK-2→BANK-3. The refresh order for BANK group 1 may be BANK-5→BANK-4→BANK-7→BANK-6. Orders of bank groups to be refreshed in dies may be configured differently for dies, as indicated by arrows in the tables in FIG. 6A to FIG. 6D. For example, the order of BANK group for Die-0 and Die-4 may be BANK Group-0→BANK Group-1→BANK Group-2→BANK Group-3, as shown in FIG. 6A. For example, the order of BANK group for Die-2 and Die-6 may be BANK Group-2→BANK Group-3→BANK Group-0→BANK Group-1, as shown in FIG. 6C. As shown in FIG. 2, power supply voltages VDD and VSS may be provided to the power circuits (e.g., the power circuits 303a and 303b in FIG. 3) effectively and uniformly through vias (the TSVs 49 in FIG. 2) coupled to the power circuits. Across the dies, the power circuits 303a are vertically aligned with one another and the power circuits 303b are vertically aligned. For example, the TSVs coupled to the power circuits 303a across the dies and the TSVs coupled to the power circuits 303b across the dies may be independent from each other, hut may he electrically coupled to each other through power wiring networks provided on each die of the dies. For each die, the power circuit on a side different from the other power circuit on the other side opposite to and distant from the side (e.g., thee power circuits 303a or 303b) may receive internal power supply voltages from the TSVs to provide the internal power supply voltages to active banks close to the power circuit, power loads for TSVs across the dies may be equalized and the internal power supply voltages may be provided to the dies in a stable manner to internal functional blocks including the plurality of banks groups, because of activating different bank groups across the dies.

Figure 7A:
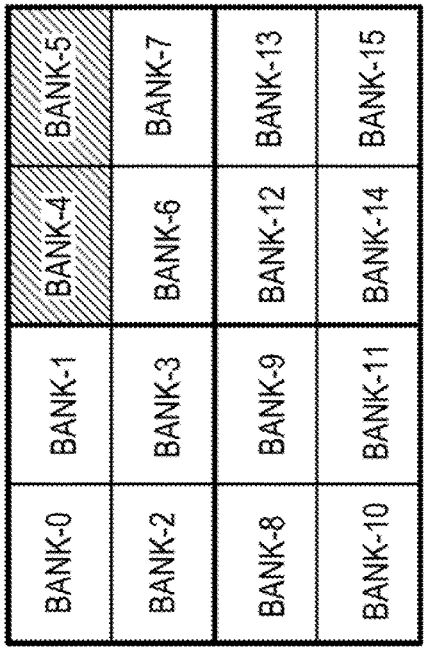
FIG. 7A to FIG. 7D are tables indicating bank addresses highlighting an initial BANK address that is included in the initial value of the convened internal refresh address for a combination of dies, in accordance with an embodiment of the present disclosure.
Figure 7B:
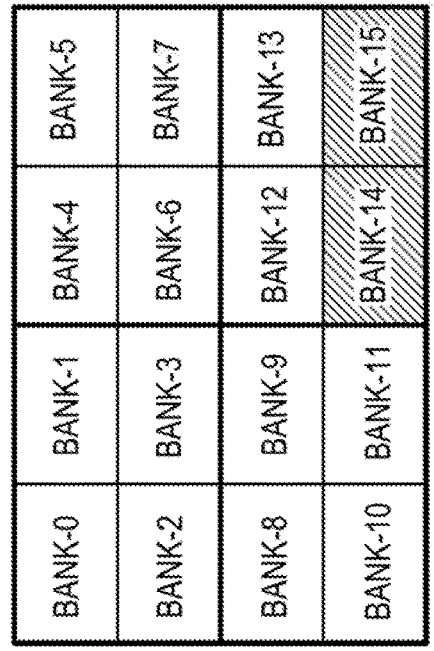
Figure 7C:
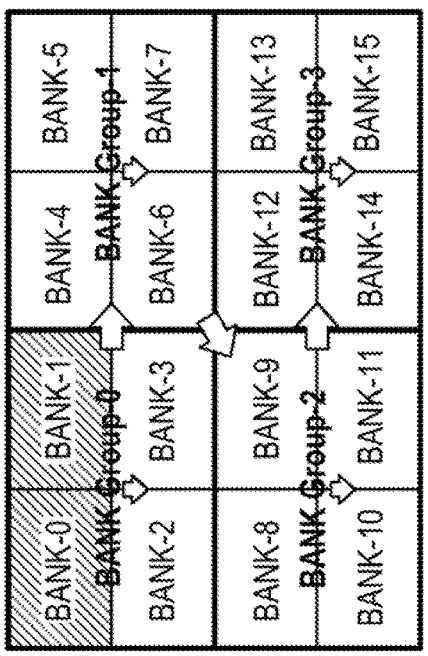
Figure 7D:
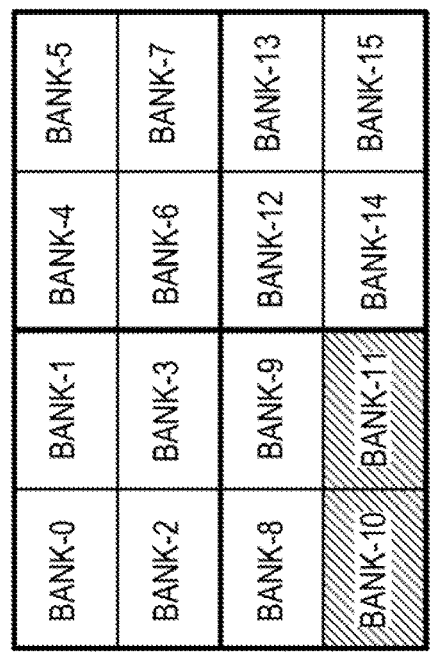

A plurality of banks, but not all banks, in one BANK Group may be refreshed simultaneously. FIG. 7A to FIG. 7D are tables indicating bank addresses highlighting an initial BANK address that is included in the initial value of the converted internal refresh address for a combination of dies, in accordance with an embodiment of the present disclosure. For each BANK group, the BANK address may be updated to refresh two hanks simultaneously, and the BANK-group address may be updated once all the BANK addresses are refreshed. Orders of banks to be refreshed in each BANK group may be configured differently for BANK groups in FIG. 7A to FIG. 7D. For example, the refresh order for BANK group 0 may be (BANK-0 and BANK-1)→(BANK-2 and BANK-3) as shown in FIG. 7A. The refresh order far BANK group 1 may be (BANK-4 and BANK-5)→(BANK-6 and BANK-7) as shown in FIG. 7B. For example, the refresh order for BANK group 2 may be (BANK-10 and BANK-11)→(BANK-8 and BANK-9) as shown in FIG. 7C. The refresh order for BANK group 3 may lie (BANK-14 and BANK-15)→(BANK-12 and BANK-13) as shown in FIG. 7D.

FIG. 8A is a block diagram of an internal clock and timing signal generator 840, a layer ID circuit 844 and a self-refresh circuit 836 in a memory die, in accordance with an embodiment of the present disclosure. For example, the internal clock and liming signal generator 840, the layer ID circuit 844 and the self-refresh circuit 836 may the internal clock and timing signal generator 40, the layer ID circuit 44 and the self-refresh circuit 36 in FIG. 2, respectively. The internal clock and timing signal generator 840 may further include a plurality of delay circuits including delay circuits 82, 831 and 837 in addition to other clock and timing signal generation functions (e.g., generating a local clock LCLK, etc.). The layer ID circuit 844 may further provide a plurality of die signals, including Die-0 to Die-7 signals corresponding to a plurality of memory dies Die-0 to Die-7. For example, a unique layer ID may be preprogrammed for each die. For example, the layer ID circuit 844 may activate one die of Die-0 to Die-7 signals responsive to the layer ID information that is indicative of the one die. For example, the delay circuits 82, 831 and 837 may receive a clock enable signal CKE and provide a delayed clock enable signal CKE_delay after delays D0, D1, D7 respectively, responsive to Die-0, Die-1 and Die-7 signals. For example, the delay circuit 82 may receive the clock enable signal CKE in an inactive state (e.g., a logic low level "0") and a Die-0 (Master) signal in an active state when the layer ID is indicative of the Die-0. Thus, based on the layer ID information indicative of the one die, one delay circuit of the plurality of delay circuits may provide the delayed clock enable signal CKE_delay.

FIG. 8B is a block diagram of signals in the internal clock and timing signal generator 840 in FIG. 8A, in accordance with an embodiment of the present disclosure. Upon a reception of a self-refresh command and the clock enable signal transitioning from an active state (e.g., a logic high level "1") to the inactive state (e.g., the logic low level "0"), a memory die may execute a self-refresh operation. As shown in FIG. 8A, output signals of the plurality of delay circuits may be provided as the delayed clock enable signal CKE_delay. A self refresh clock enable circuit 81 may include NOR circuit and an inverter and the circuit 81 may receive the clock enable signal CKE and the delayed clock enable signal CKE_delay and may further provide a CKE Self signal that is a clock enable signal to be used the self refresh circuit 836. Transition timings (e.g., from the logic high level to the logic low level) for die CKE Self signal may differ from die to die among the plurality of dies. For example, a transition liming of the CKE Self signal for Die-0 may have a delay DO from a transition timing of the clock enable signal CKE. Similarly, transition timings of the CKE Self signals for Die-1 and Die-7 may have delays D1 and D7 from the transition timing of the clock enable signal CKE, respectively. For example, the self-refresh operations for Die-0 (master die) to Die-7 (Slave) may be initiated with delays (lags) with one another in a sequence. Thus, timings of self-refresh operations that cause peak currents in the plurality of dies may be dispersed.

Logic levels of signals and logic gate combinations used in the embodiments described the above are merely examples. However, in other embodiments, combinations of logic levels of signals and combinations of logic gates other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    a first die comprising a plurality of first memory banks and a first power circuit; and
    a second die stacked on the first die, the second die comprising a plurality of second memory banks and a second power circuit;
    wherein the first die further comprises a first self-refresh circuit configured to perform a first self-refresh operation on a first memory bank among the plurality of first memory banks, wherein the first memory bank among the plurality of first memory banks is closer to the first power circuit than to the second power circuit, wherein the first die further comprises a third power circuit, a plurality of pads, and a plurality of through-substrate vias (TSVs), wherein the plurality of pads and the plurality of TSVs are disposed between the first power circuit and the third power circuit; and
    wherein the second die further comprises a second self-refresh circuit configured to perform a second self-refresh operation on a second memory bank among the plurality of second memory banks.

2. The apparatus of claim 1, wherein the second memory bank is closer to the second power circuit than to the first power circuit.

3. The apparatus of claim 2, wherein the first power circuit is not vertically aligned with the second power circuit.

4. The apparatus of claim 1, wherein the second self-refresh circuit further configured to perform the second self-refresh operation on the second memory bank among the plurality of second memory banks while the first self-refresh circuit is performing the first self-refresh operation on the first memory bank.

5. The apparatus of claim 1, wherein the second power circuit and third power circuit are vertically aligned.

6. The apparatus of claim 1, wherein the plurality of pads are disposed among a center of the first and third power circuits, and wherein the plurality of TSVs are disposed around the plurality of pads.

7. The apparatus of claim 1, wherein the plurality of pads comprises address pads, command pads, clock pads, data pads, and power supply pads.

8. The apparatus of claim 1, wherein at least one TSV of the plurality of TSVs is configured to communicate at least one signal at the plurality of pads, where the at least one TSV communicates the at least one signal from the first die to the second die.

9. The apparatus of claim 8, wherein the first memory die serves as a master die and the second memory die serves as a slave die.

10. An apparatus comprising:
a first die comprising a plurality of first memory banks and a first power circuit; and
a second die stacked on the first die, the second die comprising a plurality of second memory banks and a second power circuit;
wherein the first die further comprises a first self-refresh circuit configured to perform a first self-refresh operation on a first selected memory bank among the plurality of first memory banks, wherein the first self-refresh circuit comprises a first refresh address generator, the first refresh address generator being configured to generate an initial first self-refresh address of the first selected bank among the plurality of first memory banks and to generate an initial second self-refresh address of a second selected memory bank among the plurality of second memory banks; and
wherein the second die further comprises a second self-refresh circuit configured to perform a second self-refresh operation on the second selected memory bank among the plurality of second memory banks.

11. The apparatus of claim 10, wherein the initial first self-refresh address of the first selected bank among the plurality of first memory banks and the initial second self-refresh address of the second selected memory bank among the plurality of second memory banks are the same.

12. The apparatus of claim 10, wherein the first refresh address generator comprises a first refresh address counter and a first refresh address converter, the first refresh address converter being configured to convert an internal refresh address of the first refresh address counter into the initial first self-refresh address based partly on a provided layer ID.

13. The apparatus of claim 12, wherein the first refresh address generator further comprises a self-refresh timer configured to provide a timer signal to the first refresh address counter in a self-refresh cycle period.

14. The apparatus of claim 13, wherein, responsive to the timer signal, the first refresh address counter provides an updated internal refresh address to the first refresh address converter.

15. The apparatus of claim 10, wherein the initial first self-refresh address comprises a first address indicative of a bank group among the plurality of first memory banks and a second address of the first selected memory bank.

16. The apparatus of claim 10, wherein the first self-refresh circuit is configured to perform a third self-refresh operation on a third selected bank among the plurality of first banks.

17. The apparatus of claim 16, wherein the third selected bank is vertically aligned with the second selected bank, and wherein the third selected bank is closer to the second power circuit than to the first power circuit.

18. The apparatus of claim 10, rein the first memory bank is closer to the first power circuit than to the second power circuit.

19. An apparatus comprising a first memory die;
wherein the first memory die comprises:
a plurality of first memory banks;
a first self-refresh circuit configured to provide a plurality of first internal refresh addresses; and
a first control circuit configured to perform first refresh operations on the plurality of first memory banks responsive, at least in part, to the plurality of first internal refresh addresses;
wherein the first self-refresh circuit is further configured, responsive to first control information, to provide the plurality of first internal refresh addresses in a first order to cause the first control circuit to perform the first refresh operations on the plurality of first memory banks in the first order; and
wherein the first self-refresh circuit is further configured, responsive to second control information different from the first control information, to provide the plurality of first internal refresh addresses in a second order different from the first order to cause the first control circuit to perform the first refresh operations on the plurality of first memory banks in the second order different from the first order.

20. The apparatus of claim 19, wherein the first self-refresh circuit comprises:
a first refresh address counter configured to provide a plurality of first initial refresh addresses; and
a first refresh address converter configured, responsive to the first control information, to convert the plurality of first initial refresh addresses so that the plurality of first internal refresh addresses are provided in the first order, the first refresh address converter further configured, responsive to the second control information, to convert the plurality of first initial refresh addresses so that the plurality of first internal refresh addresses are provided in the second order.

21. The apparatus of claim 20, wherein each of the first initial refresh addresses comprises a row address, wherein each of the first initial refresh addresses further comprises at least one of a bank address and a bank group address, and wherein the at least one of a bank address and a bank group address is converted by the first refresh address converter.

22. The apparatus of claim 19, further comprising a second memory die;
wherein the second memory die comprises:
a plurality of second memory banks;
a second self-refresh circuit configured to provide a plurality of second internal refresh addresses; and
a second control circuit configured to perform second refresh operations on the plurality of second memory banks responsive, at least in part, to the plurality of second internal refresh addresses;
wherein the second self-refresh circuit is further configured, responsive to the first control information, to provide the plurality of second internal refresh addresses in the first order to cause the second control circuit to perform the second refresh operations on the plurality of second memory banks in the first order;
wherein the second self-refresh circuit is further configured, responsive to the second control information, to provide the plurality of second internal refresh addresses in the second order to cause the second control circuit to perform the second refresh operations on the plurality of second memory banks in the second order; and
wherein the first self-refresh circuit of the first memory die is provided with the first control information and the second self-refresh circuit of the second memory die is provided with the second control information.

23. The apparatus of claim 22, wherein the first and second memory dies are stacked with each other.

24. The apparatus of claim 23, wherein the first control information comprises a first layer identification (ID) and the second control information comprises a second layer ID.

25. The apparatus of claim 23, wherein the first memory die serves as a master die and the second memory die serves as a slave die.

\* \* \* \* \*